US009184243B2

(12) United States Patent
Briere (10) Patent No.: US 9,184,243 B2
(45) Date of Patent: Nov. 10, 2015

(54) MONOLITHIC COMPOSITE III-NITRIDE TRANSISTOR WITH HIGH VOLTAGE GROUP IV ENABLE SWITCH (71) Applicant: International Rectifier Corporation, El Segundo, CA (US)

(72) Inventor: Michael A. Briere, Scottsdale, AZ (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/327,495

(22) Filed: Jul. 9, 2014

(65) Prior Publication Data

US 2015/0014740 A1    Jan. 15, 2015

Related U.S. Application Data (60) Provisional application No. 61/845,913, filed on Jul. 12, 2013.

(51) Int. Cl.
*H01L 29/66* (2006.01)
*H01L 29/20* (2006.01)
*H01L 21/8258* (2006.01)
(Continued)

(52) U.S. Cl.
CPC ........ *H01L 29/2003* (2013.01); *H01L 21/8258* (2013.01); *H01L 27/0688* (2013.01); *H01L 27/0694* (2013.01); *H01L 27/085* (2013.01); *H01L 29/7393* (2013.01); *H01L 29/778* (2013.01); *H02H 7/10* (2013.01); *H02M 3/1588* (2013.01); *H01L 27/0605* (2013.01); *H01L 27/0883* (2013.01)

(58) Field of Classification Search
CPC ............ H01L 27/0688; H01L 27/0694; H01L 27/085
USPC ........................................................ 257/133
See application file for complete search history.

(56) References Cited

U.S. PATENT DOCUMENTS 6,211,549 B1   4/2001 Funaki
6,611,002 B2   8/2003 Weeks
(Continued)

FOREIGN PATENT DOCUMENTS

EP   1 643 561   4/2006
EP   2 256 799   12/2010
EP   2 546 987   1/2013

OTHER PUBLICATIONS

Chyurlia et al., "Monolithic Integration of AlGaN/GaN HFET with MOS on Silicon <111> Substrates", Electronic Letters, The Institution of Engineering and Technology, vol. 46, No. 3, Feb. 4, 2010, 2 Pages.
(Continued)

*Primary Examiner* — Douglas Menz
(74) *Attorney, Agent, or Firm* — Farjami & Farjami LLP (57) ABSTRACT There are disclosed herein various implementations of a monolithically integrated component. In one exemplary implementation, such a monolithically integrated component includes an enhancement mode group IV transistor and two or more depletion mode III-Nitride transistors. The enhancement mode group IV transistor may be implemented as a group IV insulated gate bipolar transistor (group IV IGBT). One or more of the III-Nitride transistor(s) may be situated over a body layer of the group IV IGBT, or the III-Nitride transistor(s) may be situated over a collector layer of the IGBT.

20 Claims, 5 Drawing Sheets (51) Int. Cl.
H01L 27/085 (2006.01)
H02M 3/158 (2006.01)
H01L 29/739 (2006.01)
H01L 29/778 (2006.01)
H02H 7/10 (2006.01)
H01L 27/06 (2006.01)
H01L 27/088 (2006.01)

(56) References Cited

U.S. PATENT DOCUMENTS

| | | | |
|---|---|---|---|
| 7,352,015 B2 | 4/2008 | Piner | |
| 7,566,913 B2 | 7/2009 | Therrien | |
| 7,902,809 B2 | 3/2011 | Briere | |
| 7,915,645 B2 | 3/2011 | Briere | |
| 8,338,861 B2 | 12/2012 | Briere | |
| 2009/0050939 A1 | 2/2009 | Briere | |
| 2010/0301396 A1* | 12/2010 | Briere | 257/195 |
| 2011/0080156 A1 | 4/2011 | Briere | |
| 2011/0180806 A1* | 7/2011 | Hebert | 257/76 |
| 2011/0210338 A1* | 9/2011 | Briere | 257/76 |
| 2012/0235209 A1 | 9/2012 | Briere | |
| 2013/0015498 A1 | 1/2013 | Briere | |
| 2013/0087803 A1 | 4/2013 | Kizilyalli | |
| 2013/0146888 A1 | 6/2013 | Park | |
| 2014/0375242 A1 | 12/2014 | Briere | |

OTHER PUBLICATIONS

U.S. Appl. No. 61/837,777, filed Jun. 21, 2013, Briere.
U.S. Appl. No. 61/845,913, filed Jul. 12, 2013, Briere.

* cited by examiner

ABL E SWITCH

MONOLITHIC COMPOSITE III-NITRIDE TRANSISTOR WITH HIGH VOLTAGE GROUP IV ENABLE SWITCH

The present application claims the benefit of and priority to a provisional application entitled "Integrated Group III-V FET and Group IV IGBT," Ser. No. 61/845,913 filed on Jul. 12, 2013. The disclosure in this provisional application is hereby incorporated fully by reference into the present application.

BACKGROUND

I. Definition

As used herein, "III-Nitride" or "III-N" refers to a compound semiconductor that includes nitrogen and at least one group III element such as aluminum (Al), gallium (Ga), indium (In), and boron (B), and including but not limited to any of its alloys, such as aluminum gallium nitride ($AlGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-N also refers generally to any polarity including but not limited to Ga-polar, N-polar, semi-polar, or non-polar crystal orientations. A III-N material may also include either the Wurtzitic, Zincblende, or mixed polytypes, and may include single-crystal, monocrystalline, polycrystalline, or amorphous structures. Gallium nitride or GaN, as used herein, refers to a III-N compound semiconductor wherein the group III element or elements include some or a substantial amount of gallium, but may also include other group III elements in addition to gallium. A III-N or a GaN transistor may also refer to a composite high voltage enhancement mode transistor that is formed by connecting the III-N or the GaN transistor in cascode with a lower voltage group IV transistor.

In addition, as used herein, the phrase "group IV" refers to a semiconductor that includes at least one group IV element such as silicon (Si), germanium (Ge), and carbon (C), and may also include compound semiconductors such as silicon germanium (Site) and silicon carbide (SiC), for example. Group IV also refers to semiconductor materials which include more than one layer of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

It is noted that, as used herein, the terms "low voltage" or "LV" in reference to a transistor or switch describes a transistor or switch with a voltage range of up to approximately fifty volts (50V). It is further noted that use of the term "midvoltage" or "MV" refers to a voltage range from approximately fifty volts to approximately two hundred volts (approximately 50V to 200V). Moreover, the term "high voltage" or "HV," as used herein, refers to a voltage range from approximately two hundred volts to approximately twelve hundred volts (approximately 200V to 1200V), or higher.

II. Background Art

Group III-V field-effect transistors (FETs), such as gallium nitride (GaN) or other III-Nitride based high mobility electron transistors (HEMTs), may be desirable for use in high power and high performance circuit applications due to their high efficiency and high-voltage capability. III-Nitride and other group III-V HEMTs operate using polarization fields to generate a two-dimensional electron gas (2DEG) allowing for high current densities with low resistive losses. Because the 2DEG can arise naturally at a heterojunction interface of the III-Nitride or other group III-V materials forming the HEMT, group III-V HEMTs typically conduct without the application of a gate potential. That is to say, III-Nitride and other group III-V HEMTs tend to be native depletion mode (i.e., normally ON) devices.

Although their high breakdown voltage, high current density, and low on-resistance ($R_{dson}$) render III-Nitride HEMTs advantageous for use in power applications, the normally ON nature of group III-V HEMTs can give rise to problems when such depletion mode transistors are used as power switches. For example, there is a possibility of damaging the load and circuit if the circuit powers up (i.e., bias is applied to the switch terminals) prior to biasing the gate of at least one of the depletion mode III-Nitride HEMTs to hold it in the high resistive or off-state (OFF). However, the use of depletion mode transistors enables simplified monolithic integration of multiple HEMTs. Integration is particularly important when the required devices become relatively small (e.g., less than approximately 2.0 mm$^2$) as it is often easier and less expensive to monolithically integrate smaller III-Nitride devices then it would be otherwise to singulate and package very small discrete III-Nitride devices.

SUMMARY

The present disclosure is directed to a monolithic composite III-Nitride transistor with high voltage group IV enable switch, substantially as shown in and/or described in connection with at least one of the figures, and as set forth more completely in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, due to their high efficiency and high-voltage capability III-Nitride field-effect transistors (FETs) may be desirable for use in high power and high performance circuit applications, including power conversion. Conventional power conversion circuits come in several switch configurations for use in various power management applications. Typically, silicon based metal-oxide-semiconductor field-effect transistor (MOSFET), insulated gate bipolar transistor (IGBT), super-junction field effect transistor (SJ FET), and silicon carbide (SiC) based technologies have been used in these circuits. However, more recently, III-Nitride semiconductor transistor technology, such as III-Nitride high electron mobility transistor (HEMT) technology, is being developed as an alternative to these silicon and SiC based transistors.

As further stated above, III-Nitride and other group III-V HEMTs operate using polarization fields to generate a two-dimensional electron gas (2DEG) allowing for high current densities with low resistive losses. Because the 2DEG can arise naturally at a heterojunction interface of the III-Nitride or other group III-V materials forming the HEMT, group III-V HEMTS typically conduct without the application of a gate potential. That is to say, III-Nitride and other group III-V HEMTs tend to be native depletion mode (i.e., normally ON) devices.

Although their high breakdown voltage, high current density, and low on-resistance ($R_{dson}$) render group III-V HEMTs advantageous for use in power applications, the normally ON nature of group III-V HEMTs can give rise to problems when such depletion mode transistors are used in power conversion circuits. For example, there is a possibility of damaging the load and circuit if the circuit powers up (i.e., bias is applied to the switch terminals) prior to biasing the gate of at least one of the depletion mode III-Nitride HEMTs to hold it in the high resistive or off-state (OFF).

However, the use of depletion mode transistors enables simplified monolithic integration of multiple HEMTs. Integration is particularly important when the required devices become relatively small (e.g., less than 2 mm²) as it is often easier and less expensive to monolithically integrate smaller III-Nitride devices then it would be otherwise to singulate and package very small discrete III-Nitride devices.

The present application is directed to monolithically integrated components, such as composite power devices, including one or more depletion mode (normally ON) III-Nitride transistor(s) integrated with an enhancement mode (normally OFF) group IV enable switch, suitable for use in power conversion applications. The enhancement mode group IV enable switch is implemented in the conduction path of the depletion mode III-Nitride transistor(s), in order to make or break the conduction path to or from at least one of the depletion mode III-Nitride transistors. Related circuit designs for use with low voltage (LV) depletion mode III-Nitride HEMTs using a silicon MOSFET based enable switch or protection circuit is disclosed in U.S. Pat. No. 7,902,809, entitled "DC/DC Converter Including a Depletion Mode Power Switch", and issued on Mar. 8, 2011. The entire disclosure in this patent is hereby incorporated fully by reference into the present application.

While such LV and midvoltage (MV) unipolar silicon based FETs are appropriate for the enable switch function for LV and MV circuits, IGBTs and SJ FETs are more appropriate for high voltage (HV) circuits, due to significantly better effective on-resistance for a given die size and cost.

Unlike III-Nitride switches, which may need to switch at higher frequencies based on the application, the enhancement mode group IV enable switch (e.g., IGBT or SJ FET) only needs to switch occasionally during circuit power up conditions or other system fault conditions. As a result, the switch charge of the group IV enable switch is not as critical and therefore can be optimally designed to exhibit a higher charge for the application and result in a lower cost device. Such an implementation is disclosed in U.S. patent application Ser. No. 14/302,271, entitled "Depletion Mode Group III-V Transistor with High Voltage Group IV Enable Switch," and filed on Jun. 11, 2014. The entire disclosure in this patent application is hereby incorporated fully by reference into the present application.

Figure 1:
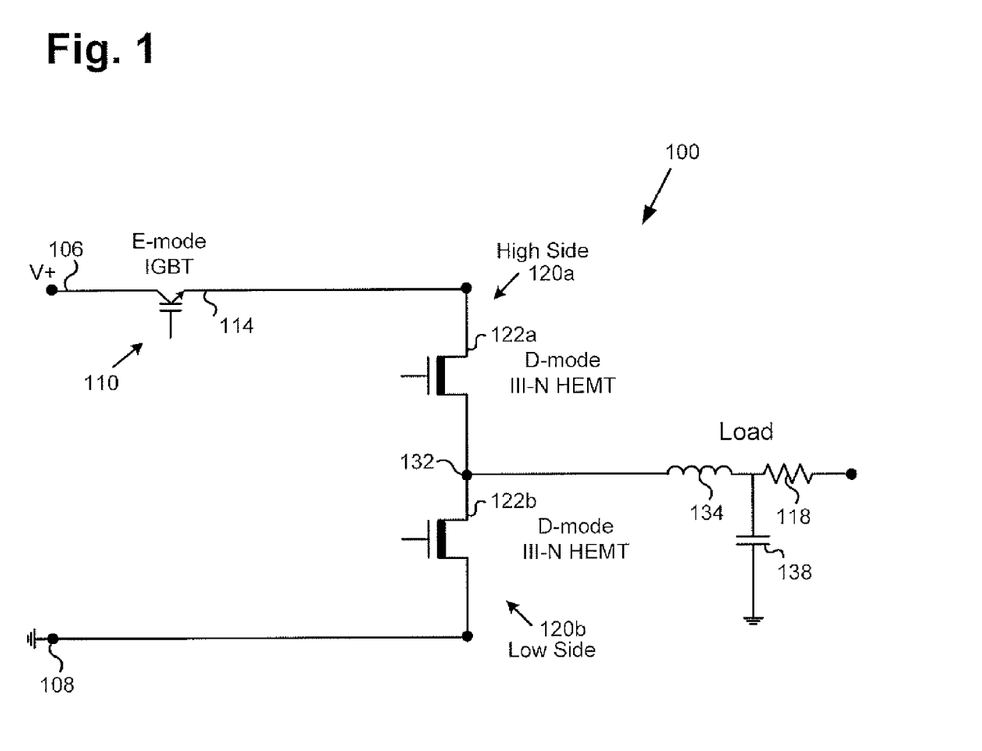
FIG. 1 shows an exemplary half bridge circuit including multiple III-Nitride transistors with a group IV insulated gate bipolar transistor (IGBT) enable switch, according to one implementation.

FIG. 1 shows exemplary half bridge circuit 100 including a combination of at least two depletion mode (also "D-mode" as labeled in the present figures) III-Nitride FETs together with an enhancement mode (also "E-mode" as labeled in the present figures) group IV enable switch, according to one implementation. Half bridge circuit 100, which may be a buck converter, for example (alternatively, a boost circuit or more generally one or more half bridge circuits or a power conversion circuit could be appropriately constructed), includes high side switch 120a coupled to low side switch 120b at switch node 132. As shown in FIG. 1, high side switch 120a and low side switch 120b are coupled between high voltage rail 106 and grounded rail 108 of half bridge circuit 100. Also shown in FIG. 1 is load 118 coupled to switch node 132 through output inductor 134, and capacitor 138. It is noted that although load 118 is represented by a resistive component in FIG. 1, more generally, load 118 may either be predominantly one of or a combination of inductance, resistance, and capacitance.

FIG. 1 provides an example of utilizing an enhancement mode enable switch on the high side rail. That is to say, enhancement mode IGBT 110 is connected in series between the input voltage V+ to high voltage rail 106 and high side switch 120a. As such, emitter 114 of IGBT 110 may be coupled to source 122a of depletion mode III-Nitride HEMT 120a, and source 122b of depletion mode III-Nitride HEMT 120b may be coupled to switch node 132. It is noted that in certain other embodiments, the enhancement mode enable switch represented by IGBT 110 may be implemented as an SJ FET or other enhancement mode HV group IV based technology.

It is further noted that in some implementations, enhancement mode group IV switch 110 and depletion mode III-Nitride transistors 120a and 120b may be LV, MV, or HV devices, as described above in the Definition section of the present application. For example, in one implementation, enhancement mode group IV switch 110 and depletion mode III-Nitride FET 120a may be configured to tolerate operating voltages of greater than approximately three hundred volts (300V).

In certain implementations, it may be advantageous or desirable that IGBT 110 be configured so as to be substantially optimized as an enable switch and formed such that it has a relatively low on-resistance and operates as a low frequency switch (i.e., switches relatively slowly). For example, when operating as an enable switch for depletion mode III-Nitride high side and low side HEMTs 120a and 120b, IGBT 110 will typically be switched at frequencies of less than approximately one hertz (1.0 Hz). As a result, high frequency operation is not required for the present implementations of an enhancement mode group IV enable switch corresponding to IGBT 110. As discussed in greater detail below, in some implementations, it may be advantageous or desirable to monolithically integrate IGBT 110 with depletion mode III-Nitride HEMT(s) 120a and/or 120b using a gallium nitride-on-silicon (GaN-on-Si) wafer technology with IGBT 110 formed in the silicon substrate. In other implementations, it may be advantageous or desirable to use die stacking integration and to electromechanically bond enhancement mode IGBT 110 to depletion mode III-Nitride HEMT(s) 120a and/or 120b.

As stated above, use of depletion mode III-Nitride HEMTs in power conversion circuits introduces the possibility that the load may be damaged if the circuit powers up (i.e., bias is applied to the switch terminals) prior to biasing the gate of a depletion mode III-Nitride HEMT to hold it OFF. Half bridge circuit 100, in which IGBT 110 is utilized as an enable switch in series with depletion mode III-Nitride FET or HEMT 120a is one way to overcome this problem. Additionally, in the event of a circuit fault, IGBT 110 can disconnect half bridge circuit 100 from high voltage rail 106 to provide protection to half bridge circuit 100, as well as to load 118 coupled to half bridge circuit 100.

Figure 2:
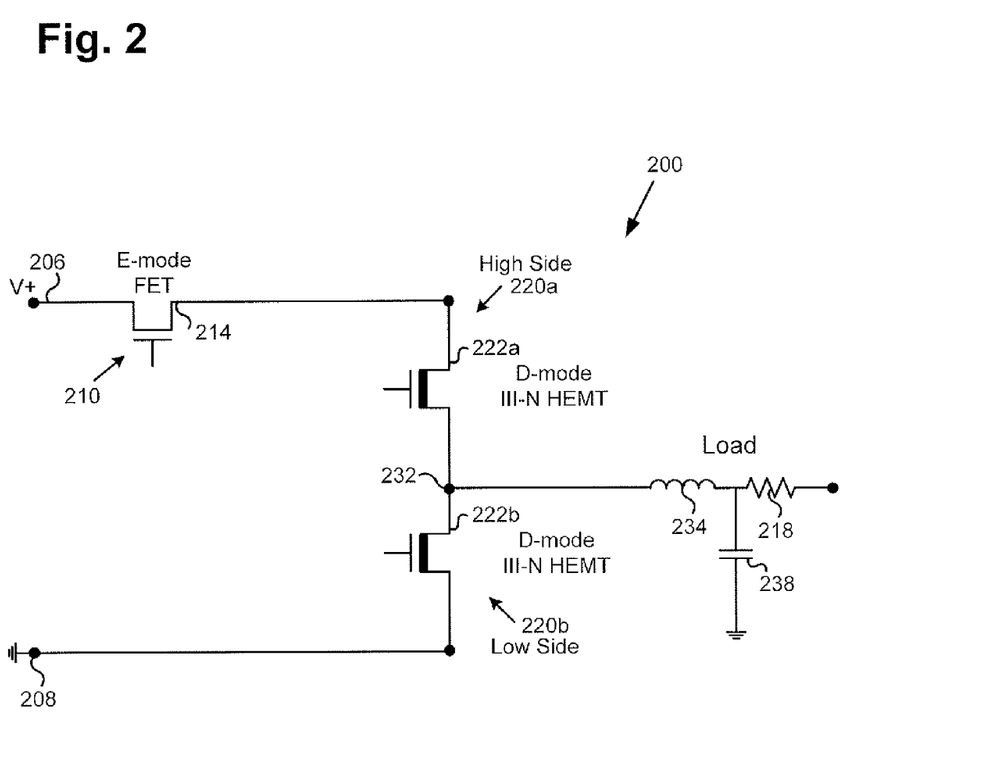
FIG. 2 shows an exemplary half bridge circuit including multiple III-Nitride transistors with an enhancement mode group IV field-effect transistor (FET) enable switch, according to another implementation.

Referring to FIG. 2, FIG. 2 shows exemplary half bridge circuit 200. FIG. 2 is another example of utilizing a switch circuit including a combination of at least two depletion mode III-Nitride FETs together with an enhancement mode group IV enable switch. Half bridge circuit 200 includes high side switch 220a coupled to low side switch 220b at switch node 232. As shown in FIG. 2, high side switch 220a and low side switch 220b are coupled between high voltage rail 206 and grounded rail 208 of half bridge circuit 200. Also shown in FIG. 2 is load 218 coupled to switch node 232 through output inductor 234, and capacitor 238. It is noted that although load 218 is represented by a resistive component in FIG. 2, more generally, load 218 may either be predominantly one of or a combination of inductance, resistance, and capacitance.

FIG. 2 provides another example of utilizing an enhancement mode enable switch on the high side rail. That is to say, enhancement mode FET 210 is connected in series between input voltage V+ to high voltage rail 206 and high side switch 220a. As such, drain 214 of FET 210 may be coupled to source 222a of depletion mode III-Nitride HEMT 220a and source 222b of depletion mode III-Nitride HEMT 220b may be coupled to switch node 232. In this example, enhancement mode enable switch 210 may be implemented as a LV, MV, or HV enhancement mode group IV FET as defined above.

As noted above by reference to FIGS. 1 and 2, in some implementations, it may be advantageous or desirable to monolithically integrate the enhancement mode group IV enable switch with one or more depletion mode III-Nitride power transistors. Such integration may be achieved, for example, using recent advances in high power III-Nitride HEMT development on silicon substrates, as well as advances in the integration of silicon based devices with III-Nitride based devices. Several examples of such integration are provided by U.S. Pat. No. 7,915,645, entitled "Monolithic Vertically Integrated Composite Group III-V And Group IV Semiconductor Device and Method For Fabricating Same", and issued on Mar. 29, 2011; U.S. patent application Ser. No. 13/020,243, entitled "Efficient High Voltage Switching Circuits And Monolithic Integration of Same", and filed on Feb. 3, 2011; U.S. patent application Ser. No. 12/174,329, entitled "III-Nitride Device", and filed on Jul. 16, 2008; and U.S. patent application Ser. No. 13/544,267 entitled "Composite Semiconductor Device with Integrated Diode", and filed on Jul. 9, 2012. The entire disclosures in the above-referenced patent and patent applications are hereby incorporated fully by reference into the present application.

Figure 3:
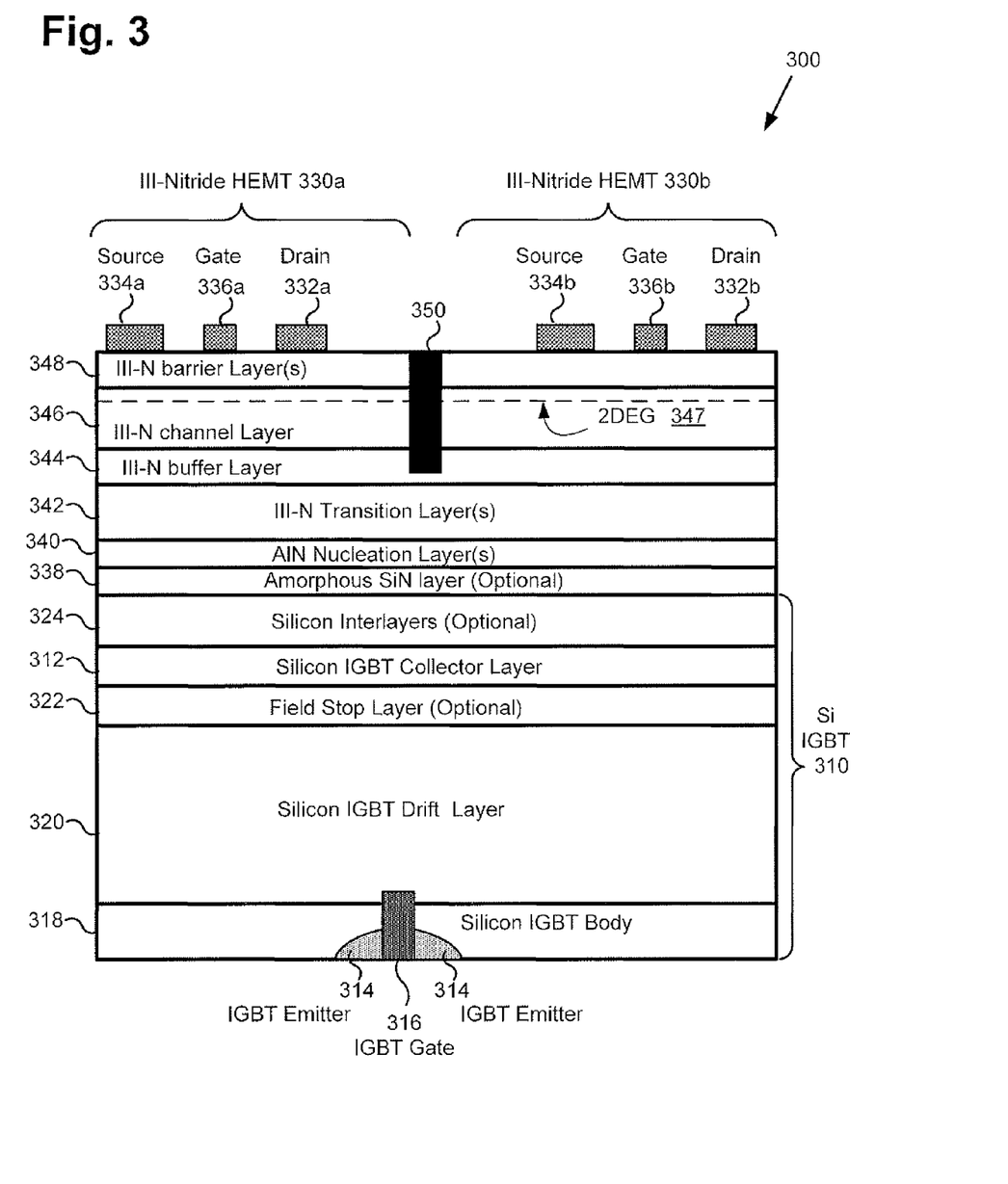
FIG. 3 shows a cross-sectional view of an exemplary monolithically integrated power device including two III-Nitride transistor and a group IV IGBT, according to one implementation.

Moving to FIG. 3, FIG. 3 shows a cross-sectional view of a monolithically integrated power device, also referred to herein as a "monolithically integrated component," including two or more depletion mode III-Nitride transistors and an enhancement mode group IV IGBT enable switch, according to one implementation. Monolithically integrated component 300 includes enhancement mode group IV IGBT switch 310 and depletion mode III-Nitride transistors 330a and 330b. Enhancement mode group IV IGBT 310 and depletion mode III-Nitride transistors 330a and 330b correspond in general to enhancement mode IGBT 110 and depletion mode III-Nitride HEMTs 120a and 120b, respectively, in FIG. 1, and may share any of the characteristics attributed to those corresponding features above. As shown in FIG. 3, in one implementation, depletion mode III-Nitride transistors 330a and 330b may be implemented as III-Nitride HEMTs, while enhancement mode group IV switch 310 may take the form of a silicon IGBT configured as an enhancement mode enable switch for depletion mode III-Nitride transistors 330a and 330b (hereinafter "III-Nitride HEMTs 330a and 330b").

As shown in FIG. 3, enhancement mode group IV IGBT 310 (hereinafter "silicon IGBT 310") is formed in the silicon substrate supporting III-Nitride HEMTs 330a and 330b. Silicon IGBT 310 includes IGBT body layer 318, drift layer 320 situated over IGBT body layer 318, collector layer 312 situated over drift layer 320, and may include optional silicon interlayers 324 situated over collector layer 312. Furthermore, in some implementations, as shown in FIG. 3, silicon IGBT 310 may also include field stop layer 322 situated between drift layer 320 and collector layer 312. In addition, silicon IGBT 310 includes emitter regions 314 and gate 316 formed in IGBT body layer 318. It is noted that in other implementations, there may be other layers and/or regions formed within a group IV IGBT enable switch corresponding to silicon IGBT 310 that are not shown in FIG. 3.

According to the exemplary implementation shown in FIG. 3, III-Nitride HEMTs 330a and 330b include optional amorphous silicon nitride (SiN) layer 338, and nucleation layer or layers 340, which may be aluminum nitride (AlN) nucleation layer(s) 340, for example, formed over silicon IGBT 310. III-Nitride HEMTs 330a and 330b also include transition layer or layers 342 situated over collector layer 312. In other words, as shown in FIG. 3, optional silicon interlayers 324 and/or optional amorphous SiN layer 338 and/or nucleation layer(s) 340 and/or transition layer(s) 342 may be situated between collector layer 312 of silicon IGBT 310 and III-Nitride buffer layer 344. As further shown in FIG. 3, III-Nitride HEMTs 330a and 330b also include buffer layer 344 situated over transition layer(s) 342, channel layer 346 situated over buffer layer 344, and barrier layer or layers 348 situated over channel layer 346.

Transition layer(s) 342 may include compositionally graded III-Nitride layers, III-Nitride superlattice structures, low temperature AlN interlayers, stress modulation layers or a combination of any above. Transition layer(s) 342, buffer layer 344, channel layer 346, and barrier layer(s) 348 may be formed so as to have any suitable III-Nitride semiconductor composition. In implementations such as that shown in FIG. 3, in which the III-Nitride transistors take the form of III-Nitride HEMTs 330a and 330b, transition layer(s) 342, buffer layer 344, channel layer 346, and barrier layer(s) 348 may be III-Nitride layers, such as GaN based layers, for example.

It is noted that barrier layer(s) 348 is/are formed over channel layer 346 having a smaller bandgap than barrier layer(s) 348, such that 2DEG 347 is generated at or near their interface. In some implementations, there may also be other interlayers, for example, one or more AlN interlayers, formed between barrier layer(s) 348 and channel layer 346, and/or III-N based cap layers formed on barrier layer(s) 348. In addition, III-Nitride HEMT 330a and 330b include respective source and drain electrodes. III-Nitride HEMT 330a includes source 334a, drain 332a, and gate 336a, which may be a Schottky gate (as shown) or an insulated gate using a gate dielectric layer under the gate (not shown in FIG. 3), for example, situated over barrier layer(s) 348. III-Nitride HEMT 330b includes source 334b, drain 332b, as well as gate 336b. Additional device layers may also be formed over the III-Nitride device structure including additional dielectric layers, source, gate and/or drain field plates, and additional metallization layers. III-Nitride HEMTs 330a and 330b are electrically isolated from each other by isolation feature 350 (e.g., isolation implant or isolation etch, for example).

It is noted that the heterojunction formed by channel layer 346 and barrier layer(s) 348 is typically formed over buffer layer 344, as well as over underlying compositionally graded transition layer(s) 342, which may include additional stress reduction layers not explicitly shown in FIG. 3. In some implementations, as shown in FIG. 3, amorphous SiN based layer 338 may be situated between nucleation layer(s) 340 and optional silicon interlayers 324 or the silicon substrate. An example of such a structure is disclosed in U.S. Pat. No. 7,352,015, entitled "Gallium Nitride Materials and Methods Associated With the Same", issued on Apr. 1, 2008. The entire disclosure in this patent is hereby incorporated fully by reference into the present application.

In some implementations, as further shown in FIG. 3, amorphous SiN layer 338, nucleation layer(s) 340, transition layer(s) 342, and buffer layer 344 are formed above the silicon layer serving as IGBT collector layer 312. In some implementations, amorphous SiN layer 338, and/or nucleation layer(s) 340, transition layer(s) 342, and buffer layer 344 may be formed directly on IGBT collector layer 312, or may be formed on silicon interlayers 324 formed between III-Nitride HEMT 330a and 330b layers and collector layer 312. Silicon interlayers 324 may include N+ layers, and/or oxide/insulating layer(s), for example. As noted above, IGBT collector layer 312 is formed on or over drift layer 320. The thickness of drift layer 320 is selected such that silicon IGBT 310 can stand off the supply voltage that III-Nitride HEMT(s) 330 and/or 330b is designed to withstand, which may be a voltage between approximately 300 V and approximately 2000 V, for example.

Underlying drift layer 320 is IGBT body layer 318. Typically, emitter regions 314 are formed within IGBT body layer 318, which is controlled using IGBT gate 316. In certain implementations, IGBT gate 316 may be formed vertically, such as in a trench, as shown in FIG. 3, or may be formed as a planar gate structure (planar gate not shown in FIG. 3). Because silicon IGBT 310 is configured to operate as a DC enable switch for III-Nitride HEMT(s) 330a and/or 330b, the design of silicon IGBT 310 may be optimized to provide a substantially minimal on-resistance, at the acceptable cost of slower switching. For example, as noted above, when operating as a DC enable switch, silicon IGBT 310 will typically be switched at frequencies of less than approximately 1.0 Hz. As a result, it is reiterated that high frequency operation is not required for the present implementations of a group IV enable switch corresponding to silicon IGBT 310. It is also noted that although the design of enable switch 310 is shown as an IGBT, in certain implementations, the design of the enable switch may take the form of a silicon or other group IV based FET, including a multiple Reduced Surface Field (RESURF), highly compensated, or super-junction based FET.

There are several ways to electrically interconnect III-Nitride HEMT(s) 330a and/or 330b and silicon IGBT 310 so as to realize the circuit configurations shown in FIG. 1 and FIG. 2. For example, III-Nitride HEMT 330a and silicon IGBT 310 may be electrically connected in series using interconnect vias, or through substrate vias or plugs, or using wire bonding techniques and packaging options know in the art. More specifically, it may be advantageous or desirable to form the electrical connections shown in FIGS. 1 and 2 through one or more bond wires, such as gold (Au) or copper (Cu) bond wires, for example. However, in other implementations, one or more bond wires may be replaced by conductive ribbons, conductive metal clips, or other connectors formed of conductive materials such as Al, Au, Cu, and/or other metals or composite materials.

Examples of the use of interconnect vias and through substrate vias used in III-Nitride epitaxial layers on a single silicon substrate and in integrating III-Nitride devices with group IV based devices are disclosed in U.S. Pat. No. 6,611,002, entitled "Gallium Nitride Material Devices and Methods Including Backside Vias," issued on Aug. 26, 2003; U.S. Pat. No. 7,566,913, entitled "Gallium Nitride Material Devices Including Conductive Regions and Methods Associated with the Same," issued on Jul. 28, 2009; U.S. Pat. No. 7,915,645, entitled "Monolithic Vertically Integrated Composite Group III-V and Group IV Semiconductor Device and Method for Fabricating Same," issued on Mar. 29, 2011; and U.S. patent application Ser. No. 12/174,329, entitled "III-Nitride Device," filed on Jul. 16, 2008. The entire disclosures in these patents and patent application are hereby incorporated fully by reference into the present application.

Figure 4:
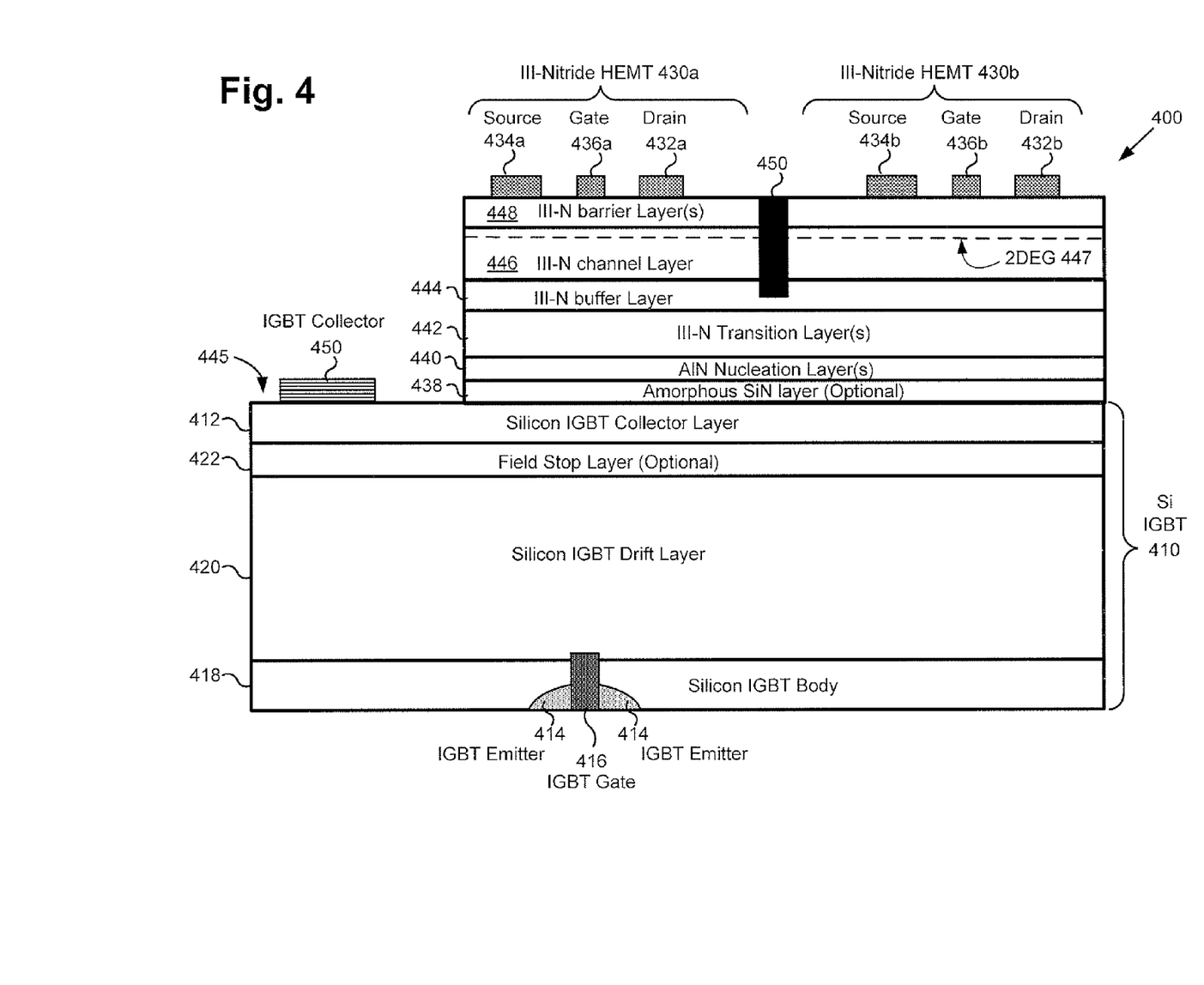
FIG. 4 shows a cross-sectional view of an exemplary monolithically integrated power device including an exposed IGBT collector layer, according to another implementation.
Figure 5:
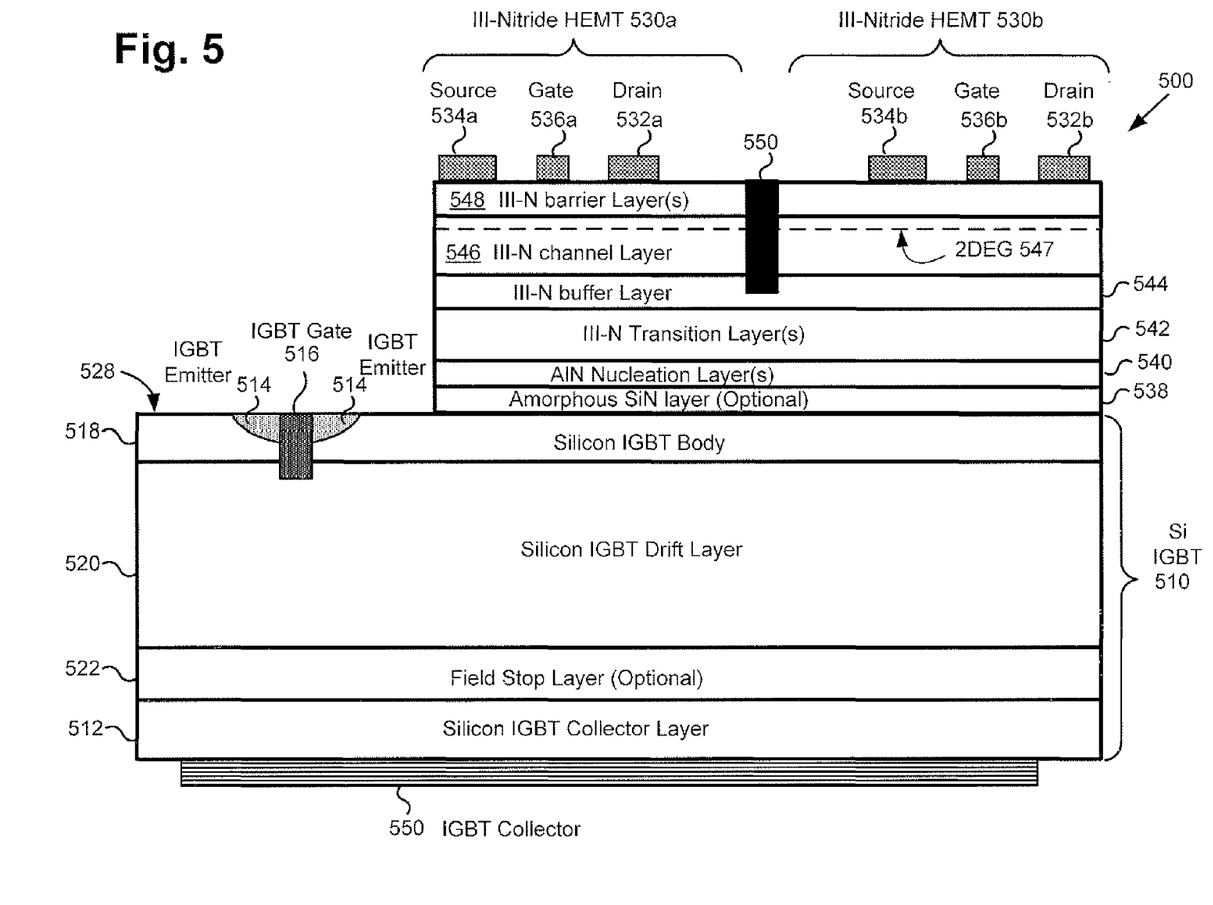
FIG. 5 shows a cross-sectional view of an exemplary monolithically integrated power device including an exposed IGBT body layer, according to yet another implementation.

FIGS. 4 and 5 show two alternative examples of monolithically integrated two or more depletion mode III-Nitride HEMTs and an enhancement mode group IV IGBT. Referring to FIG. 4, monolithically integrated component 400 includes enhancement mode group IV IGBT 410 and depletion mode III-Nitride transistors 430a and 430b. Enhancement mode group IV IGBT 410 and depletion mode III-Nitride transistors 430a and 430b correspond in general to enhancement mode IGBT 110 and depletion mode III-Nitride FETs 120a and 120b, respectively, in FIG. 1, and may share any of the characteristics attributed to those corresponding features above. As shown in FIG. 4, in one implementation, depletion mode III-Nitride transistors 430a and 430b may be implemented as III-Nitride HEMTs, while enhancement mode group IV IGBT switch 410 may take the form of a silicon IGBT configured as an enable switch for depletion mode III-Nitride transistor(s) 430a and/or 4301 (hereinafter "III-Nitride HEMTs 430a and 430b").

As shown in FIG. 4, enhancement mode group IV IGBT 410 (hereinafter "silicon IGBT 410") is formed in the silicon substrate supporting III-Nitride HEMTs 430a and 430b. Silicon IGBT 410 includes IGBT body layer 418, drift layer 420 situated over IGBT body layer 418, and collector layer 412 situated over drift layer 420. Furthermore, in some implementations, as shown in FIG. 4, silicon IGBT 410 may also include field stop layer 422 situated between drift layer 420 and collector layer 412. In addition, silicon IGBT 410 includes emitter regions 414 and gate 416 formed in IGBT body layer 418. It is noted that in other implementations, there may be other layers and/or regions formed within a group IV IGBT enable switch corresponding to silicon IGBT 410 that are not shown in FIG. 4. For example, in some implementations, silicon IGBT 410 may include silicon interlayers situated on or over collector layer 412.

According to the exemplary implementation shown in FIG. 4, III-Nitride HEMTs 430a and 430b include optional amorphous silicon nitride (SiN) layer 438, and nucleation layer or layers 440, which may be aluminum nitride (AlN) nucleation layer(s) 440, for example, formed over silicon IGBT 410. III-Nitride HEMTs 430a and 430b may also transition layers 442 situated over collector layer 412. In other words, as shown in FIG. 4, optional amorphous SiN layer 438 and/or nucleation layer(s) 440 and/or transition layer(s) 442 may be situated between collector layer 412 of silicon IGBT 410 and buffer layer 444. As further shown in FIG. 4, III-Nitride HEMTs 430a and 430b also include buffer layer 444 situated over transition layer(s) 442, channel layer 446 situated over buffer layer 444, and barrier layer or layers 448 situated over channel layer 446.

As depicted in FIG. 4, in some implementations, it may be advantageous or desirable to remove portions of certain III-Nitride HEMT layers such that a region 445 of IGBT collector layer 412 is exposed. The IGBT collector provided by collector layer 412 may be substantially coplanar with a top surface of collector layer 412 having exposed portion 445. That is to say, collector electrode 450 of silicon IGBT 410 is situated on the top side of monolithically integrated component 400, opposite IGBT emitter 414 and IGBT gate 416 regions situated on the bottom side of monolithically integrated component 400.

Transition layer(s) 442, buffer layer 444, channel layer 446, and barrier layer(s) 448 may be formed so as to have any suitable III-Nitride semiconductor composition. In implementations such as that shown in FIG. 4, in which the III-Nitride transistors take the form of III-Nitride HEMTs 430a and 430b, transition layer(s) 442, buffer layer 444, channel layer 446, and barrier layer(s) 448 may be III-Nitride layers, such as GaN based layers, for example. It is noted that barrier layer(s) 448 is/are formed over channel layer 446 having a smaller bandgap than barrier layer(s) 448, such that 2DEG 447 is generated at or near their interface. In some implementations, there may also be other interlayers, for example, one or more AlN interlayers, formed between barrier layer(s) 448 and channel layer 446, and/or III-Nitride based capping layers formed on barrier layer(s) 448.

In addition, III-Nitride HEMTs 430a and 430b include respective source and drain electrodes. III-Nitride HEMT 430a includes source 434a, drain 432a, and gate 436a, which may be a Schottky gate (as shown) or may be an insulated gate using a gate dielectric (not shown in FIG. 4), for example, situated over barrier layer(s) 448. That is to say, source electrode 434a, drain electrode 432a, and gate 436a of III-Nitride HEMT 430a are formed on the top side of monolithically integrated component 400, opposite the bottom side on which electrodes for IGBT gate 416 and emitter regions 414 are formed. Similarly, III-Nitride HEMT 430b includes source 434b, drain 434b, and gate 436b. Additional device layers may also be formed over the III-Nitride device structure including additional dielectric layers, source, gate, and/or drain field plates, and additional metallization layers. III-Nitride HEMTs 430a and 430b are electrically isolated from each other by isolation feature 450 (e.g., isolation implant or isolation etch, for example).

It is noted that the heterojunction formed by channel layer 446 and barrier layer(s) 448 is typically formed over buffer layer 444, as well as over underlying compositionally graded transition layer(s) 442, which may include additional stress reduction layers, superlattice layers, low temperature AlN interlayers or stress modulation layers not explicitly shown in FIG. 4. In some implementations, as shown in FIG. 4, amorphous SiN based layer 438 may be situated between nucleation layer(s) 440 and the aforementioned optional silicon interlayers or the silicon substrate.

In some implementations, as further shown in FIG. 4, amorphous SiN layer 438, nucleation layer(s) 440, transition layer(s) 442, and buffer layer 444 are formed over the silicon layer serving as IGBT collector layer 412. In some implementations, amorphous SiN layer 438, and/or nucleation layer(s) 440, transition layer(s) 442, and buffer layer 444 may be formed directly on IGBT collector layer 412, or may be formed on silicon interlayers formed between the III-Nitride HEMT layers and collector layer 412 (silicon interlayers not shown in FIG. 4). As noted above, IGBT collector layer 412 is formed on or over drift layer 420. The thickness of drift layer 420 is selected such that silicon IGBT 410 can stand off the supply voltage that III-Nitride HEMT(s) 430a and/or 430b is designed to withstand, which may be a voltage between approximately 300 V and approximately 2000 V, for example.

Underlying drift layer 420 is IGBT body layer 418. Typically, emitter regions 414 are formed within IGBT body layer 418, which is controlled using IGBT gate 416. In certain implementations, IGBT gate 416 may be formed vertically, such as in a trench, as shown in FIG. 4, or may be formed as a planar gate structure (planar gate not shown in FIG. 4). Because silicon IGBT 410 is configured to operate as a DC enable switch for III-Nitride HEMT(s) 430a and/or 430b, the design of silicon IGBT 410 may be optimized to provide a substantially minimal on-resistance, at the acceptable cost of slower switching, as discussed by reference to FIG. 3 above.

Now referring to FIG. 5, FIG. 5 is yet another example of monolithically integrating two or more depletion mode III-Nitride HEMTs and an enhancement mode silicon IGBT enable switch. FIG. 5 shows a cross-sectional view of an exemplary monolithically integrated power device including two or more III-Nitride transistors and a group IV IGBT enable switch having a top side gate. Monolithically integrated component 500 includes enhancement mode group IV IGBT 510 and depletion mode III-Nitride transistors 530a and 530b. Enhancement mode group IV IGBT 510 and depletion mode III-Nitride transistors 530a and 530b correspond in general to enhancement mode IGBT 110 and depletion mode III-Nitride FETs 120a and 120b, respectively, in FIG. 1, and may share any of the characteristics attributed to those corresponding features above. As shown in FIG. 5, in one implementation, depletion mode III-Nitride transistors 530a and 530b may be implemented as depletion mode III-Nitride HEMTs, while enhancement mode group IV IGBT 510 may take the form of a silicon IGBT configured as an enhancement mode enable switch for depletion mode III-Nitride depletion mode transistors 530a and 530b (hereinafter "III-Nitride HEMT 530a and 530b").

As shown in FIG. 5, enhancement mode group IV IGBT 510 (hereinafter "silicon IGBT 510") is formed in the silicon substrate supporting III-Nitride HEMTs 530a and 530b. Silicon IGBT 510 includes collector layer 512 coupled to collector electrode 550 situated on the bottom side or backside of monolithically integrated component 500, drift layer 520 situated over collector layer 512, and IGBT body layer 518 situated over drift layer 520. As shown in FIG. 5, emitter regions 514 and gate 516 of silicon IGBT 510 are situated in exposed portion 528 of IGBT body layer 518. That is to say, emitter regions 514 and gate 516 of silicon IGBT 510 are situated on the top side of monolithically integrated component 500, opposite collector electrode 550 situated on the bottom side of monolithically integrated component 500.

In some implementations, as shown in FIG. 5, silicon IGBT 510 may also include optional field stop layer 522 situated between drift layer 520 and collector layer 512. It is noted that although collector layer 512, optional field stop layer 522, drift layer 520, and IGBT body layer 518 are shown as silicon layers in FIG. 5, more generally, collector layer 512, field stop layer 522, drift layer 520, and IGBT body layer 518 may be implemented as any group IV semiconductor layers suitable for use in a group IV IGBT corresponding to silicon IGBT 510.

As further shown in FIG. 5, monolithically integrated component 500 includes III-Nitride HEMTs 530a and 530b situated over IGBT body layer 518 adjacent exposed portion 528. According to the exemplary implementation shown in FIG. 5, III-Nitride HEMTs 530a and 530b may include respective source, drain and gate electrodes. III-Nitride HEMT 530a includes source 534a, drain 532a, and gate 536a, which may be a Schottky gate (as shown) or insulated gate using a gate dielectric layer (not shown in FIG. 5), for example, formed thereon, over barrier layer(s) 548. In other words, source electrode 534a, drain electrode 532a, and gate 536a of III-Nitride HEMT 530a are formed on the top side or front side of monolithically integrated component 500, opposite the bottom side or backside side on which collector electrode 550 of silicon IGBT 510 is situated. Similarly, III-Nitride HEMT 530b includes source 534b, drain 532b and gate 536b. Additional device layers may also be formed over the III-Nitride device structure including additional dielectric layers, source, gate and/or drain field plates, and additional metallization layers. III-Nitride HEMTs 530a and 530b are electrically isolated from each other by isolation feature 550 (e.g., isolation implant or isolation etch, for example).

As shown in FIG. 5, III-Nitride HEMTs 530a and 530b include optional amorphous silicon nitride (SiN) based layer 538, and nucleation layer or layers 540, which may be aluminum nitride (AlN) nucleation layer(s) 540, for example, formed over IGBT body layer 518. III-Nitride HEMTs 530a and 530b also includes transition layer or layers 542 situated over IGBT body layer 518, buffer layer 544 situated over transition layer(s) 542, channel layer 546 situated over buffer layer 544, and barrier layer or layers 548 situated over channel layer 546. Thus, as shown in FIG. 5, optional amorphous SiN layer 538 and/or nucleation layer(s) 540 and/or transition layer(s) 542 may be situated between IGBT body layer 518 and buffer layer 544 of III-Nitride HEMTs 530a and 530b.

Transition layer(s) 542, buffer layer 544, channel layer 546, and barrier layer(s) 548 may be formed so as to have any suitable III-Nitride semiconductor composition. In implementations such as that shown in FIG. 5, in which the III-Nitride transistors take the form of III-Nitride HEMTs 530a and 530b, transition layer(s) 542, buffer layer 544, channel layer 546, and barrier layer(s) 548 may be III-Nitride layers, such as GaN based layers, for example. It is noted that barrier layer(s) 548 is/are formed over channel layer 546 having a smaller bandgap than barrier layer(s) 548, such that 2DEG 547 is generated at or near their interface. In some implementations, there may also be other interlayers, for example, one or more AlN interlayers, formed between barrier layer(s) 548 and channel layer 546, and/or III-Nitride based capping layers formed on barrier layer(s) 548.

It is noted that the heterojunction formed by channel layer 546 and barrier layer(s) 548 is typically formed over buffer layer 544, as well as over underlying compositionally graded transition layer(s) 542, which may include additional stress reduction layers, superlattice layers, low temperature MN interlayers or stress reduction module layers not explicitly shown in FIG. 5. In some implementations, as shown in FIG. 5, amorphous SiN based layer 538 may be situated between nucleation layer(s) 540 and the silicon substrate in which silicon IGBT 510 is formed as discussed above be reference to FIG. 3.

It is noted that in some implementations, there may be other layers and/or regions formed within a group IV IGBT corresponding to silicon IGBT 510 that are not shown in FIG. 5. For example, in some implementations, silicon IGBT 510 may include silicon or other group IV interlayers situated between IGBT body layer 518 and the III-Nitride HEMT layers. As a result, according to various implementations, amorphous SiN layer 538, and/or nucleation layer(s) 540, transition layer(s) 542, and buffer layer 544 may be formed directly on IGBT body layer 518, or may be formed on silicon or other group IV interlayers formed between III-Nitride HEMT layers and collector layer 512 (silicon or other group IV interlayers not shown in FIG. 5). As noted above, IGBT body layer 518 is formed on or over drift layer 520. The thickness of drift layer 520 is selected such that silicon IGBT 510 can stand off the supply voltage that III-Nitride HEMT 530a and/or 530b is designed to withstand, which may be a voltage between approximately 300 V and approximately 2000 V, for example.

As depicted in FIG. 5, in some implementations, it may be advantageous or desirable to remove portions of the III-Nitride HEMT layers so as to provide exposed portion 528 of IGBT body layer 518. Emitter regions 514 are formed within exposed potion 528 of IGBT body layer 518, which is controlled using IGBT gate 516. In certain implementations, IGBT gate 516 may be formed vertically, such as in a trench, as shown in FIG. 5, or may be formed as a planar gate structure (planar gate not shown in FIG. 5). Because silicon IGBT 510 is configured to operate as a DC enable switch for III-Nitride HEMT(s) 530a and/or 530b, the design of silicon IGBT 510 may be optimized to provide a substantially minimal on-resistance, at the acceptable cost of slower switching. For example, as noted above, when operating as a DC enable switch, silicon IGBT 510 will typically be switched at frequencies of less than approximately 1.0 Hz. As a result, it is reiterated that high frequency operation is not required for the present implementations of a group IV enable switch corresponding to silicon IGBT 510.

Thus, the present application discloses various implementations of a monolithically integrated power device including two or more III-Nitride transistors and a group IV switch. The III-Nitride transistors may be depletion mode III-Nitride transistors, and the group IV switch may be implemented as an enhancement mode silicon IGBT enable switch, or as an enhancement mode silicon FET enable switch, in the conduction path of one or more of the depletion mode III-Nitride transistors, in order to make or break the conduction path to or from at least one depletion mode III-Nitride transistor. As a result, the monolithically integrated power devices disclosed herein enable prevention of damage to a load driven by a power conversion circuit including such power devices due to premature power up (i.e., bias is applied to the switch terminals) of the circuitry prior to biasing of at least one of the depletion mode III-Nitride transistors to hold it in the high resistive of off-state (OFF). Moreover, in the event of a circuit fault, the enhancement mode group IV enable switch may be used to disconnect at least one depletion mode III-Nitride transistor from the bus or high voltage rail of the power conversion circuit to provide protection for the depletion mode III-Nitride transistors and the load.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A monolithically integrated component comprising:
an enhancement mode group IV transistor; and
at least two depletion mode III-Nitride transistors;
at least one of said at least two depletion mode III-Nitride transistors substantially overlying said enhancement mode group IV transistor.

2. The monolithically integrated component of claim 1, wherein said enhancement mode group IV transistor comprises a silicon insulated gate bipolar transistor (silicon IGBT).

3. The monolithically integrated component of claim 2, further comprising:
a body layer of said enhancement mode group IV IGBT having an emitter and a gate therein;
a drift, layer of said enhancement mode group IV IGBT;
a collector layer of said enhancement mode group IV IGBT having a collector therein;
wherein said at least two depletion mode III-Nitride transistors are situated over said body layer of said enhancement mode group IV IGBT;
and wherein said emitter and said gate of said enhancement mode group IV IGBT are situated on a top side of said monolithically integrated component.

4. The monolithically integrated component of claim 2, further comprising:
a body layer of said enhancement mode group IV IGBT having an emitter and a gate therein;
a drift layer of said enhancement mode group IV IGBT;
a collector layer of said enhancement mode group IV IGBT having a collector therein;
wherein said at least two depletion mode III-Nitride transistors are situated over said collector layer of said enhancement mode group IV IGBT;
and wherein said collector of said enhancement mode group IV IGBT is situated on a top side of said monolithically integrated component.

5. The monolithically integrated component of claim 1, wherein said enhancement mode group IV transistor comprises a silicon field-effect transistor (silicon PET).

6. The monolithically integrated component of claim 1, wherein said at least two depletion mode III-Nitride transistors comprise III-Nitride FETs.

7. The monolithically integrated component of claim 1, wherein said at least two depletion mode HI-Nitride transistors comprise III-Nitride high electron mobility transistors (III-Nitride HEMTs).

8. The monolithically integrated component of claim 1, wherein said at least two depletion mode III-Nitride transistors comprise a III-Nitride transition layer.

9. The monolithically integrated component of claim 8, further comprising a III-Nitride nucleation layer, said III-Nitride transition layer being formed over said III-Nitride nucleation layer.

10. The monolithically integrated component of claim 1, wherein said at least two depletion mode III-Nitride transistors form a power conversion circuit.

11. The monolithically integrated component of claim 10, wherein said enhancement mode group IV transistor comprises a FET.

12. The monolithically integrated component of claim 10, wherein said enhancement mode group IV transistor comprises an IGBT.

13. The monolithically integrated component of claim 1, wherein said at least two depletion mode III-Nitride transistors form at least one half bridge circuit.

14. The monolithically integrated component of claim 13, wherein said at least one half bridge circuit is configured as a power conversion circuit.

15. The monolithically integrated component of claim 1, wherein monolithic integration is based on III-Nitride epitaxial layers formed on a silicon substrate.

16. The monolithically integrated component of claim 15, wherein said enhancement mode group IV transistor is situated on and/or within said silicon substrate.

17. The monolithically integrated component of claim 1, wherein said enhancement mode group IV transistor is configured as an enable switch.

18. The monolithically integrated component of claim 1, wherein at least one of said at least two depletion mode III-Nitride transistors is electrically connected to said enhancement mode group IV transistor using at least one interconnect via.

19. The monolithically integrated component of claim 1, wherein at least one of said at least two depletion mode III-Nitride transistors further comprises an insulated gate electrode.

20. The monolithically integrated component of claim 1, wherein at least one of said at least two depletion mode III-Nitride transistors is electrically connected to said enhancement mode group IV transistor using at least one through substrate via.

* * * * *